__ __

United States Patent [19]
Kawagishi et al.

[11] Patent Number: 4,770,751
[45] Date of Patent: Sep. 13, 1988

[54] METHOD FOR FORMING ON A NONCONDUCTOR A SHIELDING LAYER AGAINST ELECTROMAGNETIC RADIATION

[75] Inventors: Shigemitsu Kawagishi, Suita; Toshiyuki Kita, Nara, both of Japan

[73] Assignee: Okuno Chemical Industry Co., Ltd., Osaka, Japan

[21] Appl. No.: 947,720

[22] Filed: Dec. 30, 1986

[51] Int. Cl.$^4$ ............................................. C23C 28/02
[52] U.S. Cl. .................... 204/30; 204/38.4; 204/38.5
[58] Field of Search .................. 204/38.4, 38.5, 30

[56] References Cited

U.S. PATENT DOCUMENTS

| | | | |
|---|---|---|---|
| 3,531,379 | 9/1970 | Peach | 204/33 |
| 3,661,538 | 5/1972 | Brown et al. | 204/38.4 X |
| 3,764,488 | 10/1973 | Bernhardt | 204/38.4 |
| 4,381,227 | 4/1983 | Narcus | 204/16 |
| 4,514,586 | 4/1985 | Waggoner | 174/35 MS |

OTHER PUBLICATIONS

F. A. Lowenheim, Electroplating, McGraw-Hill Book Co., N.Y., 1978, pp. 198–199, 389–399.
Abner Brenner, Electrodeposition of Alloys, Academic Press, N.Y., 1963, vol. II, pp. 242–245.

*Primary Examiner*—John F. Niebling
*Assistant Examiner*—William T. Leader
*Attorney, Agent, or Firm*—Varndell Legal Group

[57] ABSTRACT

This invention provides a method for forming metallic deposits on a nonconductor to provide a shield against electromagnetic radiation, the method comprising the steps of:
(i) subjecting the surface of a nonconductor to pretreatment prior to electroless copper plating,
(ii) electrolessly plating the pretreated surface of nonconductor with copper to form a copper layer about 0.5 to about 20 $\mu$m in thickness on the surface, and
(iii) immersing the copper-coated nonconductor in an electroless Ni plating solution and passing an electric current through the solution with the copper layer serving as the cathode, followed by cutting of current, to deposit as Ni layer 1.0 to about 20 $\mu$m on the copper layer.

5 Claims, No Drawings

METHOD FOR FORMING ON A NONCONDUCTOR A SHIELDING LAYER AGAINST ELECTROMAGNETIC RADIATION

FIELD OF THE INVENTION

This invention relates to shielding against electromagnetic radiation, and more particularly to a method for forming a copper layer on a nonconductor and an Ni layer on the copper layer by a wet plating method comprising specific steps.

BACKGROUND OF THE INVENTION

Electron equipment generally needs a cover with a shield material capable of shutting off electromagnetic radiation. The cover is required for preventing electromagnetic irradiation into or out of electronic apparatus and equipment.

Effective as a shield against electromagnetic radiation (hereinafter referred to as "EMR shield") are coatings formed from electrically-conductive materials. EMR shields have been produced by application of electrically-conductive paint, metal spraying, metal sputtering, adhesion of metallic foil, plating or the like to deposit a metal layer on a nonconductor. Since the effect of EMR shield has correlation with electrical conductivity, metals of high electrical conductivity such as gold, silver, copper and the like are suitable as coating materials. Generally copper, being inexpensive, is used as such material. However, copper is prone to oxidation and, on oxidation, reduces the electrical conductivity, impairing the effect of EMR shield. To diminish this defect, copper is usually coated with Ni, Co or like oxidation-resistant metals for protection. For example, U.S. Pat. No. 4,514,586 discloses an EMR shield material prepared by electrolessly plating the surface of a nonconductor with copper and then the copper layer with metals comprising nickel, cobalt, gold and alloy of these metals (these metals will be hereinafter represented by "Ni"). The disclosed method applies a catalyst layer of Pd, Pt, Au or the like to the copper layer prior to electroless plating of copper layer with Ni and like metals, since Ni and like metals are unable to deposit directly on the copper layer. However, the deposition of catalyst layer poses the problem of introducing Pd, Pt, Au or like catalyst component into the electroless plating solution containing nickel and other metals to result in the contamination and decomposition of the solution. Further the method entails difficulty in controlling the thickness of catalyst layer of Pd, Pt, Au or the like. More specifically, when a nonconductor is immersed in the catalyst solution for a prolonged period of time to provide the desired deposition of Ni or the like, the thickness of catalyst layer is excessively increased, thereby deteriorating the adhesion between the metallic deposits.

SUMMARY OF THE INVENTION

An object of the present invention is to electrolessly form a copper layer on a nonconductor and a highly adherent Ni or Ni alloy layer on the copper layer.

Another object of the invention is to deposit a highly adherent Ni or Ni alloy layer directly on the copper layer electrolessly deposited on the nonconductor without applying a catalyst layer to the copper layer.

A further object of the invention is to electrolessly form a copper layer on a nonconductor and a highly adherent Ni or Ni alloy layer on the copper layer without incorporation of Pd, Pt, Au or like catalyst component into an electroless Ni or Ni alloy plating solution.

A still further object of the invention is to prepare a material for shielding against electromagnetic radiation which material comprises a nonconductor, a copper layer electrolessly formed on the nonconductor and a highly adherent Ni or Ni alloy layer deposited on the copper layer.

Other objects and features of the invention will become apparent from the following description.

This invention provide a method for forming metallic deposits on a nonconductor to provide a shield against electromagnetic radiation, the method comprising the steps of:
(i) subjecting the surface of a nonconductor to pretreatment prior to electroless copper plating,
(ii) electrolessly plating the pretreated surface of nonconductor with copper to form a copper layer about 0.5 to about 20 $\mu$m in thickness on the surface, and
(iii) immersing the copper-coated nonconductor in an electroless Ni plating solution and passing an electric current through the solution with the copper layer serving as the cathode, followed by cutting of current, to deposit a Ni or Ni alloy layer about 1.0 to about 20 $\mu$m on the copper layer.

DETAILED DESCRIPTION OF THE INVENTION

Nonconductors useful in the invention can be any of substrates heretofore used for EMR shield materials, examples thereof being organic polymeric materials such as acrylonitrile-butadiene styrene (ABS) resin, polyacetal, polysulfone, polycarbonate, modified polycarbonate-ABS resin, polyphenylene sulfide, polypropylene, modified polyphenylene oxide, polyamide, polybutylene terephthalate, polyester (fiber and cloth), etc. and inorganic materials including glass, ceramics, etc.

The electroless plating of nonconductor with copper can be carried out by conventional methods.

For example, the specific nonconductor material is washed at a temperature of about 50° to about 60° C. for about 3 to about 10 minutes with a cleaning fluid containing about 2 to about 5% of sodium phosphate, sodium borate, sodium carbonate or the like and about 0.2 to about 1.5% of nonionic surface active agent such as $C_9H_{19}C_6H_4(OC_2H_4)_{10}OH$, R·g $O(C_2H_4O)_nH$ [R=alkyl, n=8 to 20], etc. and then with water. The material thus washed is chemically etched to give fine surface irregularity to the material, resulting in improved adhesion between the material and the copper layer. The etching treatment is performed under conditions suited to the material. The material made of ABS resin or like polymeric material is immersed in a solution of 400 g/l of $CrO_3$ and 400 g/l of $H_2SO_4$ at a temperature of about 60° to about 75° C. for about 5 to about 20 minutes.

The material is then washed with water and dipped in an HCl solution containing about 20 to about 60 ml/l of 36% HCl at a temperature of about 15° to about 40° C. for about 0.5 to about 2 minutes to remove the remnant Cr from the the surface of the material, followed by washing with water.

Thereafter the material is immersed in a catalyst solution comprising about 0.01 to about 0.3 g/l of $PdCl_2$, about 5 to about 20 g/l of $SnCl_2$ and about 100 to about 300 ml/l of HCl (36%) to apply the catalyst solution to the material surface, washed with water, immersed in about 30 to about 80 ml/l of $H_2SO_4$ (98%) to form a Pd metal layer and washed with water.

The material coated with the Pd metal layer is immersed in a electroless copper plating solution containing a copper salt, chelating agent, stabilizer, reducing agent and the like. As the copper salt, at least one of $CuSO_4$, $CuCl_2$, $Cu(CH_3COO)_2$, $CuCO_3$ and the like is used in an amount of about 5 to about 20 g/l based on the amount of copper. At least one of EDTA, EDTA derivatives, Rochelle salt, sodium gluconate, sodium nitrilotriacetate, aminotrimethylphosphoric acid and the like is used as the chelating agent in an amount of about 20 to about 100 g/l. At least one of polyethylene glycol (PEG), dipyridyls, NaCN, sulfur compounds (e.g., thiourea, mercaptobenzothiazole, etc.) and the like is used as the stabilizer in an amount of about 0.001 to about 2 g/l. At least one of formaldehyde, sodium boron hydride and the like is used as the reducing agent in an amount of about 1 to about 15 g/l. Preferred pH of the electroless copper plating solution ranges from about 12.0 to about 12.8. When required, the pH is adjusted by addition of NaOH. The plating is conducted preferably at a temperature of about 35° to about 75° C., taking time sufficient to form a copper layer about 0.5 to about 20 μm in thickness and free of pinhole.

According to the present invention, the material electrolessly plated with copper is washed with water and immersed in a $H_2SO_4$ solution comprising about 10 to about 30 ml/l of $H_2SO_4$ (98%) at a temperature of about 10° to about 40° C. for about 0.5 to about 3 minutes and in an electroless Ni or Ni alloy plating solution and an electric current is passed through the solution using the copper layer as the cathode to deposit a Ni or Ni alloy layer on the copper layer. At least one of $NiSO_4$, $NiCl_2$, $Ni(CH_3COO)_2$ and the like is used as Ni source in an amount of about 3 to about 10 g/l. Used as the chelating agent is about 20 to about 100 g/l of at least one of gluconic acid, tartaric acid, citric acid, hydroxyacetic acid, EDTA, lactic acid and the like. Used as the reducing agent is about 2 to about 40 g/l of at least one of hydrazine, sodium hypophosphite, sodium borohydride, dimethyl aminoboran (DMAB) and the like. Hydrazine is most preferable as the reducing agent. Useful electroless Ni-Fe alloy plating solution is identical in composition as electroless Ni plating solution except that the former contains about 10 to about 40 g/l of at least one of $NaH_2PO_2$, DMAB and the like as the reducing agent in place of hydrazine or the like and about 10 to about 30 g/l of at least one of $FeSO$, $FeCL_2$, and the like as the Fe source. An electric current is passed through the solution with a stainless steel panel, carbon panel or the like used as the anode at a current density of about 0.2 to about 3 A/dm$^2$ in the cathode and about 0.1 to about 0.5 A/dm$^2$ in the anode at a temperature of about 75° to about 95° C. to form electrolytically a Ni or Ni alloy layer about 0.2 to about 0.5 μm in thickness on the copper layer, followed by cutting off current and electroless plating is conducted at a temperature of about 75° to about 95° C. for about 20 to about 200 minutes to produce a Ni or Ni alloy layer about 1.0 to about 20 μm in total thickness. When the Ni alloy is composed of Ni and Fe, preferred Fe content is about 5 to about 20% by weight.

Since as described above, the electroless plating with copper can be performed in the present invention by desired conventional method, the above-specified plating compositions and plating conditions limit in no way the invention.

According to the present invention, a Ni or Ni alloy layer can be formed directly over the copper layer on the nonconductor without applying a catalyst layer of Pd, Pt, Au or the like to the copper layer. This method eliminates the possibility of decomposition of Ni or Ni alloy plating composition which otherwise would occur due to the inclusion of the catalyst metal therein. The method provides an Ni or Ni alloy layer adhered to the copper layer with improved power, thereby assuring the protection of copper layer against oxidation. Additional deposition of Ni or Ni alloy further improves the effect of EMR shield. Accordingly the method of the present invention for producing an EMR shield material can achieve outstanding results.

EXAMPLE 1

An ABS resin (trademark "Kralastic AP-8," product of Sumitomo Naugatuck Co., Ltd, Japan) was made into a sheet, 20 cm×20 cm×0.3 cm. The ABS resin sheet thus obtained was immersed in an aqueous solution containing 30 g/l of sodium phosphate and 2 g/l of nonionic surface active agent (trademark "Nonipoul 160", product of Sanyo Kasei Company Ltd. Japan) at a temperature of 55° C. for 4 minutes and washed with water, followed by degreasing.

The ABS resin sheet degreased above was immersed in an aqueous solution containing 400 g/l of $CrO_3$ and 400 g/l of $H_2SO_4$ (98%) at a temperature of 70° C. for 10 minutes, washed with water, further immersed in an aqueous solution containing 50 ml/l of HCl (36%) at 25° C. for 3 minutes, washed with water and subjected to chemically etching treatment.

The ABS resin sheet chemically etched was immersed in a catalyst solution containing 0.2 g/l of Pd, 10 g/l of $SnCl_2$ and 150 ml/l of 36% HCl at 25° C. for 4 minutes, washed with water, also immersed in an aqueous solution containing 50 ml/l of 98% $H_2SO_4$ at 25° C. for 3 minutes to form a Pd metal catalyst layer, and washed with water.

The ABS resin sheet with the Pd metal catalyst layer was dipped in an electroless copper plating solution having the composition shown below in Table 1 and having a pH of 12.2 at 55° C. for 120 minutes to give a copper layer 5 μm in thickness and washed with water.

TABLE 1

| | |
|---|---|
| $CuSO_4 \cdot 5H_2O$ | 15 g/l |
| Formaldehyde | 3 g/l |
| EDTA · 2Na | 50 g/l |
| NaCN | 50 mg/l |
| PEG (molecular weight: about 2000) | 1 g/l |
| Mercaptobenzothiazole | 0.5 mg/l |
| αα'-dipyridyl | 10 mg/l |

The ABS resin sheet electrolessly plated with copper was immersed in an aqueous solution containing 20 ml/l of 98% $H_2SO_4$ at 25° C. for 30 seconds, washed with water and further immersed in an aqueous solution at 90° C. containing 20 g/l of $NiCl_2 \cdot 6H_2O$, 50 g/l of sodium tartrate and 30 g/l of hydrazine and having a pH of 10.0. A plating was conducted by passing an electric current through the solution with the copper layer serving as the cathode and a carbon rod as the anode at a cathode current density of 0.3 A/dm$^2$ and anode current density of 0.5 A/dm$^2$ for 5 minutes to form an Ni layer 0.5 μm in thickness, whereupon current was cut off and the sheet was maintained as immersed at the same temperature for 15 minutes, giving an Ni layer having a total thickness of 2.5 μm (containing 99.7% by weight of Ni).

EXAMPLE 2

A sheet made of polybutylene terephthalate resin (trademark "PBT-5106-M04," product of Toray Industry, Inc., Japan) and measuring 20 cm×20 cm×0.3 cm was immersed in an aqueous solution containing 30 g/l of sodium phosphate and 2 g/l of nonionic surface active agent of the type used in Example 1 at a temperature of 55° C. for 4 minutes, washed with water and degreased.

The sheet of polybutylene terephthalate (hereinafter referred to as "PBT") resin thus degreased was immersed in an aqueous solution containing 200 g/l of $CrO_3$ and 550 g/l of $H_2SO_4$ at 65° C. for 5 minutes, washed with water and further immersed in an aqueous solution containing 200 g/l of NaOH, and 200 ml/g of chemical etching agent (trademark "PBT Etchant", product of Okuno Chemical Industry Co., Ltd., Japan) at 70° C. for 15 minutes, washed with water at 70° C. for 2 minutes, dipped in an aqueous soluton containing 50 ml/l of 36% HCl at 25° C. for 2 minutes and washed with water again.

The PBT sheet thus chemically etched was immersed in a catalyst solution containing 1.25 g/l of Pd, 20 g/l of $SnCl_2$ and 150 ml/l of 36% HCl at 25° C. for 3 minutes, washed with water, immersed in an aqueous solution containing 80 ml/l of 98% $H_2SO_4$ at 40° C. for 4 minutes to form a Pd metal catalyst layer on the surface, and washed with water.

The PBT sheet with the Pd metal catalyst layer was immersed in an electroless copper plating solution of the type used in Example 1 and was formed with a copper layer 5 μm in thickness under the same conditions as in Example 1, followed by washing with water.

The PBT sheet with the copper layer was immersed in an aqueous solution of 50 ml/l of 98% $H_2SO_4$ at 25° C. for 30 seconds, washed with water and also immersed in an electroless Ni-Fe plating solution having the composition as shown below in Table 2 and having a pH of 8.5.

TABLE 2

| | |
|---|---|
| Ferrous sulfate ($FeSO_4 7H_2O$) | 15 g/l |
| $NiSO_4 \cdot 6H_2O$ | 15 g/l |
| Sodium citrate | 60 g/l |
| Sodium hypophosphite | 25 g/l |
| Boric acid | 20 g/l |
| Glycine | 10 g/l |

An electric current was passed through the solution at 90° C. with the copper layer of PBT sheet as the cathode and a carbon rod as the anode at a cathode current density of 0.3 A/dm² and anode current density of 0.5 A/dm² for 5 minutes to form an Ni-Fe alloy layer 0.5 μm in thickness, the current flow was stopped and the sheet was maintained as immersed at the same temperature, thereby producing an Ni-Fe alloy layer 2.5 μm in total thickness and comprising 81% by weight of Ni, 8% by weight of Fe and 11% by weight of P.

COMPARISON EXAMPLE 1

The general procedure of Example 2 was repeated, electrolessly forming a copper layer 5 μm in thickness over a PBT sheet. The PBT sheet was washed with water, immersed in an aqueous solution containing 5 ml/l of 36% HCl and 0.05 g/l of $PdCl_2$ at 25° C. for 1 minute and washed with water.

The PBT sheet was then immersed in an electroless Ni plating solution containing 27 g/l of $NiSO_4$, 20 g/l of sodium malate, 15 g/l of sodium succinate and 20 g/l of $NaH_2PO \cdot H_2O$ and having a pH of 5.0 at 90° C. for 10 minutes to form an Ni layer 2.5 μm in thickness.

EXAMPLES 3 AND 4 AND COMPARISON EXAMPLE 2

Using the three kinds of EMR shield materials obtained in Examples 1 and 2 and Comparison Example 1, the effect of EMR shield was determined (unit expressed in decibel) according to the Dual Box method. Table 3 below shows the results.

TABLE 3

| Frequency | 0.1 MHz | | 10 MHz | | 100 MHz | | 500 MHz | | 1000 MHz | |
|---|---|---|---|---|---|---|---|---|---|---|
| Shield Material | A* | B** | A | B | A | B | A | B | A | B |
| Ex. 3 (Prep. in Ex. 1) | Over 120 | 3.4 | Over 120 | 35.0 | 108.7 | 58.1 | 102.0 | 81.2 | 103.5 | 95.1 |
| Ex. 4 (Prep. in Ex. 2) | Over 120 | 4.1 | Over 120 | 40.8 | 110.6 | 75.1 | 105.3 | 85.1 | 104.4 | 102.8 |
| Comp. (Prep. in Ex. 2 Comp. Ex. 1) | Over 120 | 2.6 | Over 120 | 27.5 | 103.4 | 47.6 | 98.2 | 71.0 | 95.3 | 85.9 |

Note:
*A stands for electric field.
**B stands for magnetic field.

Generally the decrease of 10 decibels is regarded as corresponding to about 90% signal reduction in an unshielded state, the decrease of 20 decibels to about 99% signal reduction and the decrease of 30 decibels to about 99.9% signal reduction in such state.

Accordingly Table 3 reveals that the shield materials of the invention exhibit outstanding performance.

EXAMPLES 5 AND 6 AND COMPARISON EXAMPLE 3

A peeling test was carried out using the three kinds of EMR shield materials obtained Examples 1 and 2 and Comparison Example 1 as follows. The layer on each shield material was cut crosswise to the substrate to make 100 squares, each 1 mm×1 mm, according to JIS Z-1522. Adhesive tape was adhered to the surface thus cut, pressed uniformly with a uniform force and peeled off rapidly. The number of remaining squares was counted.

No peeling was found on the shield material obtained in Example 1 (test in Example 5), nor on the shield material obtained in Example 2 (test in Example 6).

However, peeling reached as high as 30% on the shield material obtained in Comparison Example 1 (test in Comparison Example 3).

The general procedure of Comparison Example 1 was repeated to produce two kinds of shield materials except that the amount of Pd catalyst deposit was increased by extending the time taken for immersion in PdCl$_2$-containing aqueous solution and in HCL-containing aqueous solution to 3 minutes and 5 minutes, respectively. The two kinds of shield material thus obtained were subjected to the same peeling test as above and found to have a peeling ratio raised by 80% and 100%, respectively with the increase in the amount of Pd catalyst deposit.

We claim:

1. A method for forming metallic deposits on a nonconductor to provide a shield against electromagnetic radiation, the method comprising the steps of:
   (i) subjecting the surface of a nonconductor to pretreatment prior to electroless copper plating,
   (ii) electrolessly plating the pretreated surface of nonconductor with copper to form a copper layer about 0.5 to about 20 μm in thickness on the surface, and
   (iii) immersing the copper-coated nonconductor in an electroless Ni or Ni alloy plating solution and passing an electric current at a cathode current density of about 0.2 to about 3 A/dm$^2$ through the solution with the copper layer serving as the cathode, followed by cutting off current, to deposit a Ni or Ni alloy layer about 1.0 to about 20 μm on the copper layer, said Ni or Ni alloy layer comprising an electrolytically formed layer of about 0.2 to about 0.5 μm in thickness and an electrolessly formed layer of about 0.8 to about 19.5 μm in thickness.

2. A method according to claim 1 wherein the nonconductor is an organic polymeric material.

3. A method according to claim 1 wherein the nonconductor is an inorganic material.

4. A method according to claim 1 wherein the Ni alloy is a Ni-Fe alloy.

5. A method according to claim 4 wherein the Fe content is about 5 to about 20% by weight.

* * * * *